(12) United States Patent
Wang et al.

(10) Patent No.: US 12,413,239 B2
(45) Date of Patent: Sep. 9, 2025

(54) SEGMENTED CAPACITANCE CALIBRATION CIRCUIT APPLIED IN PURE CAPACITOR ARRAY STRUCTURE

(71) Applicant: IPGoal Microelectronics (Sichuan) Co., Ltd., Sichuan (CN)

(72) Inventors: Lun Wang, Sichuan (CN); Xiangyang Guo, Sichuan (CN)

(73) Assignee: IPGOAL MICROELECTRONICS (SICHUAN) CO., LTD., Chengdu (CN)

( * ) Notice: Subject to any disclaimer, the term of this patent is extended or adjusted under 35 U.S.C. 154(b) by 155 days.

(21) Appl. No.: 18/395,853

(22) Filed: Dec. 26, 2023

(65) Prior Publication Data

US 2024/0171191 A1 May 23, 2024

(30) Foreign Application Priority Data

Nov. 24, 2023 (CN) .......................... 202311595284.9

(51) Int. Cl.
| | |
|---|---|
| H03M 1/10 | (2006.01) |
| H03M 1/46 | (2006.01) |
| H03M 1/68 | (2006.01) |
| H03M 1/80 | (2006.01) |

(52) U.S. Cl.
CPC ....... H03M 1/1023 (2013.01); H03M 1/1009 (2013.01); H03M 1/68 (2013.01); H03M 1/804 (2013.01); H03M 1/466 (2013.01)

(58) Field of Classification Search
CPC ...... H03M 1/1023; H03M 1/68; H03M 1/804; H03M 1/466; H03M 1/1009

USPC .................................................. 341/120, 172
See application file for complete search history.

(56) References Cited

U.S. PATENT DOCUMENTS

| | | | |
|---|---|---|---|
| 7,605,741 B2 * | 10/2009 | Hurrell ............... | H03M 1/1047 |
| | | | 341/118 |
| 10,243,577 B1 * | 3/2019 | Berens ................ | H03M 1/1042 |
| 2010/0201552 A1 | 8/2010 | Kuo et al. | |
| 2018/0269893 A1 | 9/2018 | Chang et al. | |

FOREIGN PATENT DOCUMENTS

CN          103475373 A       12/2013

\* cited by examiner

*Primary Examiner* — Khai M Nguyen
(74) *Attorney, Agent, or Firm* — SHIMOKAJI IP

(57) ABSTRACT

A segmented capacitance calibration circuit applied in a pure capacitor array structure includes a first calibration unit, a second calibration unit and a selection switch which are all connected with a scaling capacitor. The first and second calibration units include at least one capacitor, and the selection switch is configured to select the first or second calibration unit to be connected to the pure capacitor array structure. When the first calibration unit is connected to the pure capacitor array structure and in parallel with the scaling capacitor, a negative error calibration is performed on the scaling capacitor. When the second calibration unit is connected to the pure capacitor array structure and in series with the scaling capacitor, a positive error calibration is performed on the scaling capacitor. The nonlinear problem caused by the precision error of the scaling capacitor in the pure capacitor array structure is solved.

8 Claims, 2 Drawing Sheets

SEGMENTED CAPACITANCE CALIBRATION CIRCUIT APPLIED IN PURE CAPACITOR ARRAY STRUCTURE

FIELD OF THE INVENTION

The invention relates to the technical field of integrated circuits, and particularly to a segmented capacitance calibration circuit applied in a pure capacitor array structure.

BACKGROUND OF THE INVENTION

An analog-to-digital converter (ADC) plays an important role in analog circuits, and is most widely used in the successive approximation register (SAR) ADC circuit for example. The structure of SAR ADC includes resistor-resistor (pure resistor) type, capacitor-resistor (hybrid) type, and capacitor-capacitor (pure capacitor) type. Specifically, the resistor-resistor type is used less because of the high power consumption, and the capacitor-capacitor type is not often used in high-precision ADCs because of the overlarge the total capacitors area. While the capacitor-resistor type is most commonly used.

Although the area for total capacitors in the capacitor-capacitor structure cannot be ignored, it is still used in some important cases because of its fast response speed and small power consumption. During the application, a scaling capacitor is commonly added in the circuit for reducing the total capacitance.

FIG. 1 shows the comparison between a pure capacitor array structure (the upper part of FIG. 1) with a scaling capacitor and an original array (the lower part of FIG. 1) without a scaling capacitor, where Cs is denoted as the scaling capacitor. Due to the existence of the scaling capacitor Cs, it is possible to make all the capacitors in the MSB (least significant bit) capacitor array not follow a 2× relationship. In addition, due to the scaling capacitor Cs, all the capacitors in the LSB (least significant bit) capacitor array have the same weight as the original array. The total capacitance value of the original array is 32C (where C is a capacitance value preset based on the comprehensive consideration of layout design and cost, and reflects the relationship between capacitance values of capacitors). With the scaling capacitor, the total capacitance of the entire array is 31C/8+Cs. Since the series combination of the scaling capacitor Cs and the LSB capacitor array must be connected to the left side of the MSB capacitor array, and the total capacitance of the LSB capacitor array is C/8, therefore, $$\frac{1}{Cs} = \frac{8}{C} - \frac{1}{2C} = \frac{15}{2C}.$$

According to the above calculation, the capacitance value of the scaling capacitor Cs is 2C/15. The total capacitance value of the entire capacitor array is 31C/8+2C/15. Obviously, the total capacitance after adding the scaling capacitor Cs is reduced by about 8 times compared with the total capacitance of the original array. This is a very large improvement for high-precision SAR ADCs, which means that the capacitor area of the entire array is greatly improved.

However, the disadvantage of adding the scaling capacitor Cs is that the capacitance value of the scaling capacitor Cs is often a non-integer multiple of C. In consideration of capacitance mismatch, the minimum capacitor in the least significant bit in the LSB capacitor array is often a non-integer multiple of C as well. Therefore, it's difficult to match the capacitance value of scaling capacitor Cs in practical application, which results in errors, and in turn, results in errors on each individual capacitor in the LSB capacitor array.

Therefore, it is necessary to provide a segmented capacitance calibration circuit that can calibrate the scaling capacitor and be applicable to the pure capacitor array structure to overcome the above defects.

SUMMARY OF THE INVENTION

The present invention aims to provide a segmented capacitance calibration circuit applied in a pure capacitor array structure, which can calibrate the error of the scaling capacitor in the pure capacitor array with high precision, and solve the nonlinear problem caused by the precision error of the scaling capacitor in the pure capacitor array structure.

To achieve the above objective, the present invention provides a segmented capacitance calibration circuit applied in a pure capacitor array structure, and arranged between a most significant bit capacitor array and a least significant bit capacitor array of a pure capacitor array structure. The segmented capacitance calibration circuit includes a first calibration unit, a second calibration unit and a selection switch which are all connected with a scaling capacitor of the pure capacitor array structure, both the first calibration unit and the second calibration unit includes at least one capacitor, and the selection switch is configured to select the first calibration unit or the second calibration unit to be connected to the pure capacitor array structure. When the scaling capacitor generates a negative error, the selection switch is connected, and the first calibration unit is connected to the pure capacitor array structure and connected in parallel with the scaling capacitor so as to perform a negative error calibration on the scaling capacitor; when the scaling capacitor generates a positive error, the selection switch is disconnected, and the second calibration unit is connected to the pure capacitor array structure and connected in series with the scaling capacitor so as to perform a positive error calibration on the scaling capacitor.

As a preferable embodiment, the first calibration unit includes n sets of first calibration subunits, each set of the first calibration subunits includes a first switch, and two first capacitors that are identical, and the two first capacitors and the first switch are connected in series; when the first switch in any set of the first calibration subunits is connected, the first calibration subunit in a current set is connected in parallel with the scaling capacitor, where n denotes a number of sets for the first calibration subunits, and also denotes a number of levels for the negative error calibration, and n is a natural number greater than or equal to 1.

As a preferable embodiment, a reference capacitance value is set to be twice a product of a total capacitance value of the least significant bit capacitor array and a preset calibration value; for a first set of the first calibration subunits, a capacitance value of the first capacitor in the first set is the reference capacitance value, and a capacitance value of the first capacitor in any one other set of the first calibration subunits is equal to a sum of a capacitance value of the first capacitor in a previous set of first calibration subunits and the reference capacitance value.

As a preferable embodiment, the second calibration unit includes m sets of second calibration subunits, each set of the second calibration subunits includes a second switch and a second capacitor connected in series; when the second switch in any set of the second calibration subunits is connected, the second calibration subunit in a current set is connected in series with the scaling capacitor, where m denotes a number of sets for the second calibration subunits, and also denotes a number of levels for the positive error calibration, and m is a natural number greater than or equal to 1.

As a preferable embodiment, a capacitance value of the scaling capacitor is set as Cs, and an error of the scaling capacitor Cs to be calibrated by an xth set of the second calibration subunits is denoted as bx, a capacitance value of the second capacitor in the xth set of the second calibration subunits is denoted as Cx, where 1≤x≤m, and a formula for calculating the capacitance value Cx of the second capacitor is as follows:

$$\frac{1}{Cs+bx} + \frac{1}{Cx} = \frac{1}{Cs}.$$

As a preferable embodiment, when the selection switch is disconnected, each first switch is disconnected.

As a preferable embodiment, the selection switch, each first switch and each second switch are in a form of a transmission gate.

As a preferable embodiment, the selection switch, each first switch and each second switch are all includes a P-type MOS tube and an N-type MOS tube with same sizes, sources of the P-type MOS tube and the N-type MOS tube are jointly connected to form an input/output end of the first switch or the second switch, drains of the P-type MOS tube and the N-type MOS tube are jointly connected to form another input/output end of the first switch or the second switch, and gates of the P-type MOS tube and N-type MOS tube form a control end of the first switch or the second switch.

In comparison with the prior arts, in the segmented capacitance calibration circuit of the present invention, a first calibration unit for the negative error calibration, and a second calibration unit positive error calibration are configured, which can be selectively connected to the pure capacitor array structure. When the first calibration unit is selected and connected in parallel with the scaling capacitor, to increase the total capacitance of the circuit, so as to offset the negative error of the scaling capacitor. When the second calibration unit is selected and connected in series with the scaling capacitor, to decrease the total capacitance of the circuit, so as to offset the positive error of the scaling capacitor. In such a way, the error calibration of the scaling capacitor is realized, and the nonlinear problem caused by the precision error of the scaling capacitor in the pure capacitor array is solved.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
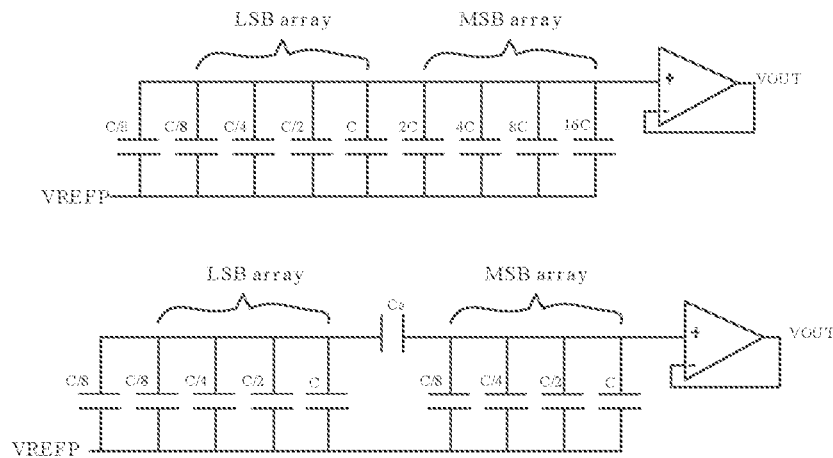
FIG. 1 is a schematic diagram of a conventional pure capacitor array structure.

Referring to the accompanying drawings, the embodiments of the present invention are described. Similar reference numerals in the drawings represent similar elements. As described above, the present invention provides a segmented capacitance calibration circuit applied in a pure capacitor array structure, which can calibrate the error of the scaling capacitor in the pure capacitor array with high precision, and solve the nonlinear problem caused by the precision error of the scaling capacitor in the pure capacitor array structure.

Figure 2:
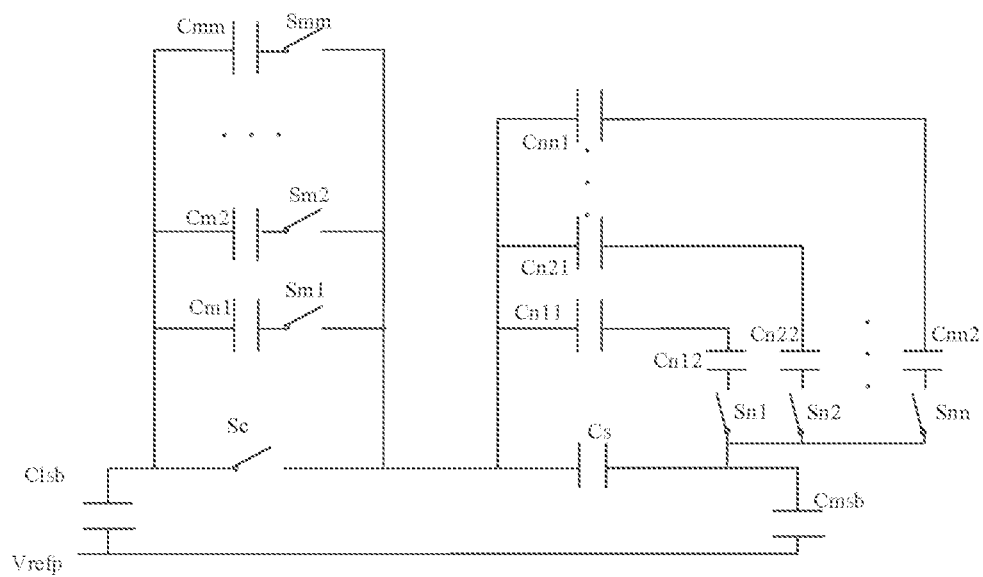
FIG. 2 is a schematic diagram of a segmented capacitance calibration circuit applied in a pure capacitor array structure according to one embodiment of the present invention.

FIG. 2 is a schematic diagram of a segmented capacitance calibration circuit applied in a pure capacitor array structure according to one embodiment of the present invention. As shown, the segmented capacitance calibration circuit is arranged between a most significant bit (MSB) capacitor array and a least significant bit (LSB) capacitor array of a pure capacitor array structure. Specifically, in FIG. 2, the capacitor Cmsb is equivalent to the MSB capacitor array and the capacitor Clsb is equivalent to the LSB capacitor array. The calibration circuit includes a first calibration unit, a second calibration unit and a selection switch Sc which are all connected with a scaling capacitor Cs of the pure capacitor array structure. Both the first calibration unit and the second calibration unit include at least one capacitor. The selection switch is configured to select the first calibration unit or the second calibration unit to be connected to the pure capacitor array structure. When the scaling capacitor Cs generates a negative error, the selection switch Sc is connected (in turned-on state), and the first calibration unit is connected to the pure capacitor array structure and connected in parallel with the scaling capacitor Cs so as to perform a negative error calibration on the scaling capacitor Cs. When the scaling capacitor Cs generates a positive error, the selection switch is disconnected (in turn-off state), and the second calibration unit is connected to the pure capacitor array structure and connected in series with the scaling capacitor Cs so as to perform a positive error calibration on the scaling capacitor Cs. The connection/disconnection of the selection switch Sc can be controlled by an external circuit and is not discussed in detail in the present invention.

By this token, when the scaling capacitor Cs generates a negative error, the selection switch Sc is connected, so that the first calibration unit is connected to the pure capacitor array structure and connected in parallel with the scaling capacitor Cs. Furthermore, the first calibration unit includes at least one capacitor, that is, the scaling capacitor Cs is connected in parallel with at least one capacitor, so that the total capacitance value in the circuit is increased to offset the negative error of the scaling capacitor Cs. When the scaling capacitor Cs generates a positive error, the selection switch Sc is disconnected, so that the second calibration unit is connected to the pure capacitor array structure and connected in series with the scaling capacitor Cs. Furthermore, the second calibration unit includes at least one capacitor, that is, the scaling capacitor Cs is connected in series with at least one capacitor, so that the total capacitance value in the circuit is decreased to offset the positive error of the scaling capacitor Cs. In such a way, the error calibration of the scaling capacitor Cs is realized, and the nonlinear problem caused by the precision error of the scaling capacitor Cs in the pure capacitor array is solved.

Specifically, referring to FIG. 2, the first calibration unit in the segmented capacitance calibration circuit includes n sets of first calibration subunits, each set of the first calibration subunits includes a first switch Sn (Sn1, Sn2 . . . Snn) and two identical first capacitors Cn1 (Cn11, Cn21 . . . Cnn1) and Cn2 (Cn12, Cn22 . . . Cnn2). The two first capacitors Cn1 and Cn2, and the first switch Sn are connected in series. When the first switch of any set of the first calibration subunits is connected, the first calibration subunit in the current set is connected in parallel with the scaling capacitor Cs, where n denotes a number of sets for the first calibration subunits, and also denotes a number of levels for the negative error calibration. In the present invention, each first calibration subunit is provided with two identical first capacitors Cn1 and Cn2 connected in series, that's because an equivalent capacitor with relatively smaller capacitance value will be obtained after the two capacitors are connected in series, while a single capacitor with a small capacitance value will lead to a large mismatch coefficient of the entire circuit to reduce the calibration accuracy. Therefore, in the present invention, an equivalent capacitor with relatively small capacitance value is obtained by connecting two first capacitors Cn1 and Cn2 in series, thereby solving the problem of mismatch to realize the calibration of scaling capacitor Cs. Specifically, n is a natural number greater than or equal to 1. Taking the first set of the first calibration subunits as an example, the first calibration subunit includes the first switch Sn1, and two first capacitors Cn11 and Cn12. The two first capacitors Cn11 and Cn12 are connected in series with the first switch Sn1. When the first switch Sn1 is connected, the first set of the first calibration subunits is connected in parallel with the scaling capacitor Cs, that is, the first capacitor Cn11 and Cn12 in series connection are connected in parallel with the scaling capacitor Cs, and then connected to the pure capacitor array circuit, so that the total capacitance value connected in the circuit is increased so as to offset the negative error of the scaling capacitor Cs. Specifically, a capacitance value of the minimum capacitor (LSB capacitor, the capacitor with the capacitance value of c/8 as shown in FIG. 1) in the LSB capacitor array is set as k, a calibration accuracy factor is set as a, and a reference capacitance value g is set as twice the product of the calibration accuracy factor a and the capacitance value k of the LSB capacitor, that is, g=2k*a. For the first set of the first calibration subunits, the capacitance value of the first capacitors Cn11 and Cn12 in the first set is the reference capacitance value, that is, the capacitance value of the first capacitors Cn11 and Cn12 is denoted as g. The capacitance value of the first capacitors Cn1 and Cn2 in any one other set of the first calibration subunits is the sum of the capacitance value of the first capacitors Cn1 and Cn2 in a previous set of the first calibration subunits and the reference capacitance value g. In other words, the capacitance value of the first capacitors Cn21 and Cn22 in the second set of the first calibration subunits is 2g, and the capacitance value of the first capacitors Cn31 and Cn32 in the third set is 3g, . . . and the capacitance value of the first capacitors Cnn1 and Cnn2 in the nth set is ng.

Further, referring to FIG. 4, as an example with four sets of the first calibration subunits (that is, n=4), a negative error calibration with the first calibration unit is performed on the scaling capacitor Cs as follows. When the selection switch Sc and the first switch S41 are both connected, and the first switches S42, S43 and S4 are disconnected, the scaling capacitor Cs is equivalently connected in parallel with a capacitor of 0.5 g capacitance, and the total capacitance is increased by 0.5g (namely the capacitance after the first capacitors Cn11 and Cn12 are connected in series). When the selection switch Sc and the first switch S42 are both connected, and the first switches S41, S43 and S44 are disconnected, the scaling capacitor Cs is connected in parallel with 1 g capacitance (namely the capacitance after the first capacitors Cn21 and Cn22 are connected in series), and the total capacitance is increased by 1 g. When the selection switch Sc and the first switch S43 are both connected, and the first switches S41, S42 and S44 are disconnected, the scaling capacitor Cs is equivalently connected in parallel with a capacitor of 1.5g capacitance (the capacitance after the first capacitors Cn31 and Cn32 are connected in series), and the total capacitance is increased by 1.5g. When the selection switch Sc and the first switch S44 are connected, and the first switches S41, S42 and S43 are disconnected, the scaling capacitor Cs is capacitance connected in parallel with a capacitor of 2g capacitance (the capacitance after the first capacitors Cn41 and Cn42 are connected in series), and the total capacitance is increased by 2g. To sum up, in this first calibration unit with the four sets of first calibration subunits, the calibration range of the capacitance value is from a*k to 4a*k, and the accuracy of the calibrated capacitance value is a*k. Obviously, the more the first calibration subunit of the scaling capacitor Cs in parallel (namely, the larger the value of n), the larger the calibration range, with an unchanged accuracy of the calibration. Therefore, it's optional to set an appropriate value of n according to the actual demands, to obtain the appropriate calibration range, which is not limited in the present invention.

In addition, as shown in FIG. 2, in the present invention, the second calibration unit includes m sets of second calibration subunits, where m is a natural number greater than or equal to 1. Each set of the second calibration subunits includes a second switch Sm (Sm1, Sm2 . . . Smm) and a second capacitor Cm (Cm1, Cm2 . . . Cmm). The second switch Sm is connected in series with the second capacitor Cm. When the second switch Sm in any set of the second calibration subunits is connected, the second calibration subunit in the current set is connected in series with the scaling capacitor Cs, where m denotes a number of sets for the second calibration subunits, and also denotes a number of levels for the positive error calibration, and m is a natural number greater than or equal to 1. Taking the first set of the second calibration subunits as an example, the second calibration subunit includes a second switch Sm1 and a second capacitor Cm1. When the second switch Sm1 is connected, the first set of the second calibration subunits is connected in parallel with the scaling capacitor Cs. That is, the second capacitor Cm1 and the scaling capacitor Cs are connected in series and then connected to the pure capacitor array circuit, so that the total capacitance value connected in the circuit is reduced so as to offset the positive error of the scaling capacitor Cs. Specifically, the capacitance value of the scaling capacitor Cs is denoted as Cs, the error of the scaling capacitor Cs to be calibrated by the xth set of the second calibration subunits is denoted as bx, the capacitance value of the second capacitor Cmx of the xth set of the second calibration subunits is denoted as Cx (where 1≤x≤m), and the formula for calculating the capacitance value Cx of the second capacitor Cmx of any set of the second calibration subunits is as follows:

$$\frac{1}{Cs+bx} + \frac{1}{Cx} = \frac{1}{Cs} \qquad (1)$$

By this token, the error calibration of the scaling capacitor Cs can be carried out based on a preset error, when the second capacitor Cm is selected with an appropriate capacitance value in each set of second calibration subunits.

Figure 4:
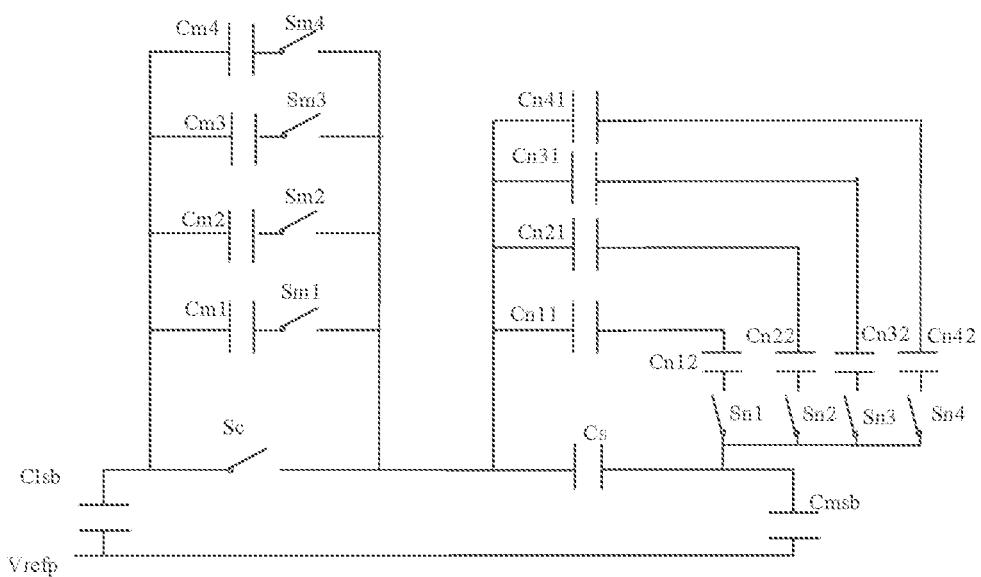
FIG. 4 is a schematic diagram of a segmented capacitance calibration circuit applied in a pure capacitor array structure according to another embodiment of the present invention.

Specifically, referring to FIG. 4, as an example, the error calibration process with the second calibration unit is explained. Since the capacitance value k of the scaling capacitor Cs is approximate to that of the LSB capacitor in the LSB capacitor array, thus it's presumed that Cs=k in the calibration process, and the reference calibration error is set as h. It's understood that, the error in the first level of the calibration is the reference calibration error, namely the reference calibration error h=bx/x=b1. As an example, four sets (namely, m=4) of second calibration subunits are set, and the positive error calibration on the scaling capacitor Cs by the second calibration unit is explained as follows. Presumed that, the error of each level is h, 2h, 3h, 4h respectively, the sum of the capacitance value of the corresponding scaling capacitor Cs and the error capacitance value is k+h, k+2h, k+3h, and k+4h respectively. Specifically, when the error of the first level is h (i.e. h=b1, x=1), the second switch Sm1 is connected, and the selection switch Sc and the second switches Sm2, Sm3 and Sm4 are disconnected, thus the capacitor with the capacitance value of k+h is connected in series with the second capacitor Cm1 with the capacitance value of k/h (calculated by formula (1)) to form the capacitor in the circuit, and the capacitance value of the equivalent capacitor obtained after the series connection is 1/[1/(k+h)+h/k]. When the error of the second level is 2h (i.e. b2, x=2), the second switch Sm2 is connected, and the selection switch Sc and the second switches Sm1, Sm3 and Sm4 are disconnected, thus the capacitor with the capacitance value of k+2h is connected in series with the second capacitor Cm2 with the capacitance value of k/2h (calculated by formula (1)) to form the capacitor in the circuit, and the capacitance value of the equivalent capacitor obtained after the series connection is 1/[1/(k+2h)+2h/k]. When the error of the third level is 3h (i.e. b3, x=3), the second switch Sm3 is connected, and the selection switch Sc and the second switches Sm1, Sm2 and Sm4 are disconnected, thus the capacitor with the capacitance value of k+3h is connected in series with the second capacitor Cm3 with the capacitance value of k/3h (calculated by formula (1)) to form the capacitor in the circuit, and the capacitance value of the equivalent capacitor obtained after the series connection is 1/[1/(k+3h)+3b/k]. When the error of the fourth level is 4h (i.e. b4, x=4), the second switch Sm4 is connected, and the selection switch Sc and the second switches Sm1, Sm2 and Sm3 are disconnected, thus the capacitor with the capacitance value of k+4h is connected in series with the second capacitor Cm4 with the capacitance value of k/4h (calculated by formula (1)) to form the capacitor in the circuit, and the capacitance value of the equivalent capacitor obtained after the series connection is 1/[1/(k+4h)+4b/k]. After the above calculations of the four sets of second calibration subunits, it can be seen that the capacitance value of the equivalent capacitor obtained after series connection in any set is less than k, and the value of k is depended on the specific value of x (namely the selected level for the calibration) which is corresponding with the error value size of the scaling capacitor Cs. Therefore, by connecting the second calibration subunit corresponding to the current calibration level to the pure capacitor array structure, the capacitance error of the scaling capacitor Cs can be calibrated within the range of H−m*h, and the capacitance accuracy of the calibration is h. Obviously, the more second calibration subunit of the scaling capacitor Cs in series (the larger the value of m), the larger the calibration range, with an unchanged accuracy of the calibration. Therefore, it's optional to set an appropriate value of m according to the actual demands, to obtain the appropriate calibration range, which is not limited in the present invention.

In addition, since each of the first calibration subunits is in parallel connection with the scaling capacitor Cs, and each of the second calibration subunits is in series connection with the scaling capacitor Cs, when the selection switch is disconnected so that the second calibration unit is used, all of the first switches Sn (Sn1, Sn2 . . . Snn) are disconnected, thereby avoiding influence on the second calibration subunit.

Figure 3:
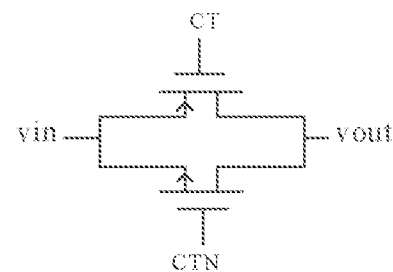
FIG. 3 is a schematic diagram of a switch structure in the segmented capacitance calibration circuit applied in a pure capacitor array structure according to one embodiment of the present invention.

As a preferred embodiment of the present invention, all switches, including the selection switch, each first switch and each second switch, are switches in the form of transmission gates to solve the nonlinear problem caused by charge injection. As shown in FIG. 3, each switch includes a P-type MOS tube and an N-type MOS tube with the same size. The sources of the P-type MOS tube and the N-type MOS tube are jointly connected to form an input/output end Vin of the switch, the drains of the P-type MOS tube and the N-type MOS tube are jointly connected to form another input/output end Vout of the switch, and the gates (CT, CTN) of the P-type MOS tube and N-type MOS tube form the control end of the switch. In addition, in the present invention, each switch may be manually controlled by the operators one by one, or by a peripheral control circuit. Specific control modes are not limited in the present invention, as long as the switches at each level can be controlled one by one.

The above-mentioned embodiments only represent several embodiments of the present invention, and the descriptions thereof are relatively specific and detailed, but should not be construed as limiting the scope of the patent invention. It should be pointed out that for those skilled in the art, several modifications and improvements can be made without departing from the concept of the present invention, which all belong to the protection scope of the present invention. Therefore, the scope of protection of the patent of the present invention shall be subject to the appended claims.

What is claimed is:

1. A segmented capacitance calibration circuit applied in a pure capacitor array structure, arranged between a most significant bit capacitor array and a least significant bit capacitor array of a pure capacitor array structure, wherein the segmented capacitance calibration circuit comprises a first calibration unit, a second calibration unit and a selection switch which are all connected with a scaling capacitor of the pure capacitor array structure, both the first calibration unit and the second calibration unit comprises at least one capacitor, and the selection switch is configured to select the first calibration unit or the second calibration unit to be connected to the pure capacitor array structure;

when the scaling capacitor generates a negative error, the selection switch is connected, and the first calibration unit is connected to the pure capacitor array structure and connected in parallel with the scaling capacitor so as to perform a negative error calibration on the scaling capacitor;

when the scaling capacitor generates a positive error, the selection switch is disconnected, and the second calibration unit is connected to the pure capacitor array structure and connected in series with the scaling capacitor so as to perform a positive error calibration on the scaling capacitor.

2. The segmented capacitance calibration circuit applied in a pure capacitor array structure according to claim 1, wherein the first calibration unit comprises n sets of first calibration subunits, each set of the first calibration subunits comprises a first switch, and two first capacitors that are identical, and the two first capacitors and the first switch are connected in series; when the first switch in any set of the first calibration subunits is connected, the first calibration subunit in a current set is connected in parallel with the scaling capacitor, where n denotes a number of sets for the first calibration subunits, and also denotes a number of levels for the negative error calibration, and n is a natural number greater than or equal to 1.

3. The segmented capacitance calibration circuit applied in a pure capacitor array structure according to claim 2, wherein a reference capacitance value is set to be twice a product of a total capacitance value of the least significant bit capacitor array and a preset calibration value; for a first set of the first calibration subunits, a capacitance value of the first capacitor in the first set is the reference capacitance value, and a capacitance value of the first capacitor in any one other set of the first calibration subunits is equal to a sum of a capacitance value of the first capacitor in a previous set of first calibration subunits and the reference capacitance value.

4. The segmented capacitance calibration circuit applied in a pure capacitor array structure according to claim 2, wherein the second calibration unit comprises m sets of second calibration subunits, each set of the second calibration subunits comprises a second switch and a second capacitor connected in series; when the second switch in any set of the second calibration subunits is connected, the second calibration subunit in a current set is connected in series with the scaling capacitor, where m denotes a number of sets for the second calibration subunits, and also denotes a number of levels for the positive error calibration, and m is a natural number greater than or equal to 1.

5. The segmented capacitance calibration circuit applied in a pure capacitor array structure according to claim 4, wherein a capacitance value of the scaling capacitor is set as Cs, and an error of the scaling capacitor Cs to be calibrated by an xth set of the second calibration subunits is denoted as bx, a capacitance value of the second capacitor in the xth set of the second calibration subunits is denoted as Cx, where $1 \leq x \leq m$, and a formula for calculating the capacitance value Cx of the second capacitor is as follows:

$$\frac{1}{Cs+bx} + \frac{1}{Cx} = \frac{1}{Cs}.$$

6. The segmented capacitance calibration circuit applied in a pure capacitor array structure according to claim 4, wherein when the selection switch is disconnected, each first switch is disconnected.

7. The segmented capacitance calibration circuit applied in a pure capacitor array structure according to claim 4, wherein the selection switch, each first switch and each second switch are in a form of a transmission gate.

8. The segmented capacitance calibration circuit applied in a pure capacitor array structure according to claim 7, wherein the selection switch, each first switch and each second switch are all comprises a P-type MOS tube and an N-type MOS tube with same sizes, sources of the P-type MOS tube and the N-type MOS tube are jointly connected to form an input/output end of the first switch or the second switch, drains of the P-type MOS tube and the N-type MOS tube are jointly connected to form another input/output end of the first switch or the second switch, and gates of the P-type MOS tube and N-type MOS tube form a control end of the first switch or the second switch.

* * * * *